(12) United States Patent
Korol et al.

(10) Patent No.: US 11,271,566 B2
(45) Date of Patent: Mar. 8, 2022

(54) DIGITAL LOGIC COMPATIBLE INPUTS IN COMPOUND SEMICONDUCTOR CIRCUITS

(71) Applicant: Integrated Device Technology, Inc., San Jose, CA (US)

(72) Inventors: Victor Korol, San Diego, CA (US); Roberto Aparicio Joo, San Diego, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 222 days.

(21) Appl. No.: 16/220,399

(22) Filed: Dec. 14, 2018

(65) Prior Publication Data

US 2020/0195251 A1    Jun. 18, 2020

(51) Int. Cl.
| | | |
|---|---|---|
| *H01L 21/8252* | (2006.01) | |
| *H03K 19/094* | (2006.01) | |
| *H01L 23/31* | (2006.01) | |
| *H01L 23/532* | (2006.01) | |
| *H02P 9/30* | (2006.01) | |

(52) U.S. Cl.
CPC ... *H03K 19/09403* (2013.01); *H01L 21/8252* (2013.01); *H01L 23/3114* (2013.01); *H01L 23/53209* (2013.01); *H02P 9/305* (2013.01)

(58) Field of Classification Search
CPC ...... H01L 21/8252; H02P 9/305; H02P 9/307; H03K 19/094–09403; H03K 19/09421; H03K 19/01721; H03K 19/0021–0027
See application file for complete search history.

(56) References Cited

U.S. PATENT DOCUMENTS

| | | | | |
|---|---|---|---|---|
| 4,142,114 A | * | 2/1979 | Green | G05F 3/205 327/536 |
| 4,508,937 A | * | 4/1985 | Burger | H04M 1/665 379/373.02 |
| 4,844,563 A | * | 7/1989 | MacMillan | H03K 19/018535 326/70 |
| 4,845,435 A | * | 7/1989 | Bohan, Jr. | G01R 31/50 324/537 |
| 4,994,729 A | * | 2/1991 | Taylor | G05F 1/463 323/314 |
| 5,214,782 A | * | 5/1993 | McCurdy, Jr. | G06F 1/28 713/340 |
| 5,397,934 A | * | 3/1995 | Merrill | G05F 3/242 327/537 |
| 5,539,351 A | * | 7/1996 | Gilsdorf | H02M 3/07 327/379 |
| 5,576,648 A | * | 11/1996 | Rossi | H03K 17/0822 323/282 |

(Continued)

*Primary Examiner* — Sophia T Nguyen
(74) *Attorney, Agent, or Firm* — Christopher P. Maiorana, PC

(57) ABSTRACT

An apparatus includes a device comprising a semiconductor junction configured to generate a reference voltage, a voltage divider circuit, a comparator circuit, and a first output circuit. The voltage divider circuit may be configured to generate a first predetermined threshold voltage in response to the reference voltage. The comparator circuit may be configured to generate a first intermediate signal in response to a comparison of the first predetermined threshold voltage and an input signal. The first output circuit may be configured to generate a first output signal in response to the first intermediate signal.

12 Claims, 6 Drawing Sheets

(56) References Cited

U.S. PATENT DOCUMENTS

| | | | | |
|---|---|---|---|---|
| 5,581,254 A * | 12/1996 | Rundel | G05B 19/19 | 318/811 |
| 5,612,643 A * | 3/1997 | Hirayama | H01L 27/0222 | 327/534 |
| 5,747,978 A * | 5/1998 | Gariboldi | G05F 1/465 | 323/313 |
| 5,814,979 A * | 9/1998 | Grimm | H02M 3/1588 | 323/284 |
| 5,835,965 A * | 11/1998 | Taylor | G11C 5/066 | 711/211 |
| 6,037,832 A * | 3/2000 | Kaminishi | H01S 5/042 | 323/312 |
| 6,064,872 A * | 5/2000 | Vice | H03D 7/14 | 455/326 |
| 6,101,121 A * | 8/2000 | Rolandi | G11C 11/5642 | 365/185.03 |
| 6,208,124 B1 * | 3/2001 | Fuchigami | G05F 1/565 | 323/281 |
| 6,219,273 B1 * | 4/2001 | Katti | G11C 11/15 | 365/158 |
| 6,314,480 B1 * | 11/2001 | Nemazie | G06F 3/0658 | 710/74 |
| 6,335,255 B1 * | 1/2002 | Evaldsson | H01L 21/8252 | 257/E21.697 |
| 6,353,357 B1 * | 3/2002 | Kaiser | H03K 19/0027 | 326/34 |
| 6,515,903 B1 * | 2/2003 | Le | G11C 16/30 | 327/536 |
| 6,781,417 B1 * | 8/2004 | Le | G05F 3/242 | 326/17 |
| 7,098,833 B2 * | 8/2006 | Stulik | H03M 1/38 | 326/56 |
| 7,359,811 B1 * | 4/2008 | Liu | G06F 30/34 | 702/69 |
| 7,639,041 B1 * | 12/2009 | Perisetty | H03K 19/0016 | 326/38 |
| 7,639,067 B1 * | 12/2009 | Perisetty | H02M 3/073 | 326/41 |
| 7,714,620 B1 * | 5/2010 | Xu | H03K 5/2481 | 327/63 |
| 7,717,620 B2 * | 5/2010 | Hebert | B31B 70/74 | 383/203 |
| 7,816,959 B1 * | 10/2010 | Isik | H03L 7/18 | 327/156 |
| 7,973,608 B2 * | 7/2011 | Kato | H03L 7/0995 | 331/17 |
| 8,487,673 B2 * | 7/2013 | Xiao | H03K 19/17764 | 327/143 |
| 8,754,680 B2 * | 6/2014 | Xiao | G06F 1/24 | 327/143 |
| 8,773,086 B1 * | 7/2014 | Kozhumam | H02M 3/156 | 323/266 |
| 9,106,255 B1 | 8/2015 | Zhang | H03M 3/496 | |
| 9,698,787 B1 | 7/2017 | Agrawal | H03K 19/018514 | |
| 9,831,882 B1 | 11/2017 | Chen | H03L 7/087 | |
| 9,847,869 B1 * | 12/2017 | Wu | H03L 7/104 | |
| 9,953,714 B2 * | 4/2018 | Yanagidaira | G11C 7/04 | |
| 9,954,541 B1 * | 4/2018 | Goyal | H03L 7/099 | |
| 10,678,724 B1 * | 6/2020 | ChoFleming | G06F 13/24 | |
| 2002/0082799 A1 * | 6/2002 | Pramanik | G01D 3/02 | 702/130 |
| 2002/0109540 A1 * | 8/2002 | Meng | H02M 3/07 | 327/536 |
| 2003/0001637 A1 * | 1/2003 | Jung | H03L 7/0805 | 327/158 |
| 2003/0189246 A1 * | 10/2003 | Iwaki | H01L 25/162 | 257/706 |
| 2004/0061565 A1 * | 4/2004 | Austin | H03B 5/1852 | 331/177 V |
| 2004/0160250 A1 * | 8/2004 | Kim | H03L 7/0995 | 327/158 |
| 2005/0270089 A1 * | 12/2005 | Shor | G05F 3/30 | 327/539 |
| 2006/0103434 A1 * | 5/2006 | Okamoto | G11C 5/145 | 327/77 |
| 2006/0170462 A1 * | 8/2006 | Bhattacharya | H03K 3/02337 | 327/77 |
| 2007/0205824 A1 * | 9/2007 | Perisetty | H03K 19/17784 | 327/536 |
| 2007/0229142 A1 * | 10/2007 | Jeong | H01L 27/092 | 327/437 |
| 2008/0062802 A1 * | 3/2008 | Lin | G11C 11/413 | 365/227 |
| 2008/0115000 A1 * | 5/2008 | Demolli | H03K 17/223 | 713/340 |
| 2008/0122511 A1 * | 5/2008 | Mei | H03K 19/00323 | 327/170 |
| 2008/0136381 A1 * | 6/2008 | Yang | G11C 16/30 | 323/220 |
| 2008/0304335 A1 * | 12/2008 | Shin | G11C 5/145 | 365/189.07 |
| 2009/0015336 A1 * | 1/2009 | Aoki | H03F 3/245 | 330/285 |
| 2009/0034354 A1 * | 2/2009 | Resnick | G11C 5/147 | 365/228 |
| 2009/0237132 A1 * | 9/2009 | Wang | H03L 7/18 | 327/157 |
| 2010/0052112 A1 * | 3/2010 | Rogers | B81C 1/0038 | 257/625 |
| 2010/0134085 A1 * | 6/2010 | Nishida | H02M 3/1563 | 323/285 |
| 2010/0225300 A1 * | 9/2010 | Lyles | G01R 19/1659 | 324/76.11 |
| 2010/0259185 A1 * | 10/2010 | Sadwick | H05B 45/37 | 315/291 |
| 2011/0215789 A1 * | 9/2011 | Bouwman | G05F 3/30 | 323/313 |
| 2012/0120739 A1 * | 5/2012 | Fujioka | G06F 1/3203 | 365/189.07 |
| 2012/0133634 A1 * | 5/2012 | Her | H03F 1/0211 | 345/212 |
| 2013/0049864 A1 * | 2/2013 | Ikehata | G11C 7/1057 | 330/253 |
| 2013/0120026 A1 * | 5/2013 | Zanchi | H03K 5/2445 | 327/77 |
| 2014/0111010 A1 * | 4/2014 | Kumar | H03K 19/0008 | 307/31 |
| 2014/0266010 A1 * | 9/2014 | Newlin | H02J 7/00 | 320/107 |
| 2015/0002161 A1 * | 1/2015 | Abdullah | G06F 1/3212 | 324/433 |
| 2015/0084143 A1 * | 3/2015 | Fujikata | H01L 31/02327 | 257/432 |
| 2015/0171737 A1 * | 6/2015 | Pagano | G01R 19/0092 | 323/284 |
| 2015/0286239 A1 * | 10/2015 | Regier | G05F 3/16 | 324/76.11 |
| 2015/0365112 A1 * | 12/2015 | Alon | H03F 3/195 | 375/297 |
| 2016/0084903 A1 * | 3/2016 | Melamed-Kohen | G01R 31/3181 | 324/750.3 |
| 2016/0173066 A1 * | 6/2016 | Yang | H03K 19/01714 | 327/109 |
| 2016/0182079 A1 * | 6/2016 | Worley | H03M 1/68 | 341/145 |
| 2016/0265501 A1 * | 9/2016 | Miyazawa | H03K 17/567 | |
| 2016/0294180 A1 * | 10/2016 | Pagano | H03K 17/04123 | |
| 2017/0108890 A1 * | 4/2017 | Nagasawa | G05F 5/00 | |
| 2017/0117717 A1 * | 4/2017 | Pagano | H02J 50/10 | |
| 2017/0170821 A1 * | 6/2017 | Marini | H03K 17/08122 | |
| 2017/0261537 A1 * | 9/2017 | Chong | G01R 31/3004 | |
| 2017/0346400 A1 * | 11/2017 | Li | H02M 3/1582 | |
| 2017/0366168 A1 * | 12/2017 | Roberg | H03F 3/195 | |
| 2018/0152177 A1 * | 5/2018 | Yang | H03K 3/037 | |
| 2019/0028018 A1 * | 1/2019 | Datta | H02M 3/00 | |
| 2019/0109589 A1 * | 4/2019 | Kobayashi | H02H 3/243 | |

(56) References Cited

U.S. PATENT DOCUMENTS

| | | | |
|---|---|---|---|
| 2019/0199347 A1* | 6/2019 | Joo | H03K 17/693 |
| 2020/0007088 A1* | 1/2020 | Ranta | H03F 1/22 |
| 2020/0018782 A1* | 1/2020 | Gupta | G01R 19/16552 |
| 2020/0101277 A1* | 4/2020 | Feldman | A61N 1/025 |
| 2020/0142462 A1* | 5/2020 | Durham | G06F 1/28 |
| 2020/0195251 A1* | 6/2020 | Korol | H01L 23/3114 |
| 2020/0235660 A1* | 7/2020 | Rana | H02M 3/07 |

* cited by examiner

DIGITAL LOGIC COMPATIBLE INPUTS IN COMPOUND SEMICONDUCTOR CIRCUITS

FIELD OF THE INVENTION

The invention relates to compound semiconductor circuits generally and, more particularly, to a method and/or apparatus for implementing digital logic compatible inputs in compound semiconductor based integrated circuits.

BACKGROUND

Digital logic circuits are designed to input and output two types of signals: a logic "1" or HIGH and a logic "0" or LOW. The HIGH state is typically represented by the full supply voltage and the LOW state is typically represented by a circuit ground potential. However, real digital circuits cannot output ideal voltage levels, and are designed to accept substantial deviation from the ideal values. Conventional compound semiconductor integrated circuits (ICs), such as gallium arsenide (GaAs) based ICs, are typically paired with silicon ICs to facilitate digital control of the compound semiconductor ICs.

It would be desirable to implement digital logic compatible inputs in compound semiconductor based integrated circuits.

SUMMARY

The invention concerns an apparatus including a device comprising a semiconductor junction configured to generate a reference voltage, a voltage divider circuit, a comparator circuit, and a first output circuit. The voltage divider circuit may be configured to generate a first predetermined threshold voltage in response to the reference voltage. The comparator circuit may be configured to generate a first intermediate signal in response to a comparison of the first predetermined threshold voltage and an input signal. The first output circuit may be configured to generate a first output signal in response to the first intermediate signal.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing digital logic compatible inputs in compound semiconductor based integrated circuits that may (i) provide input threshold voltage level(s) that is(are) stable over variations in process, voltage, and/or temperature (PVT), (ii) allow CMOS logic level control of III-V compound semiconductor circuits, (iii) be implemented using gallium arsenide (GaAs) process technology, (iv) be utilized to implement circuits that transition to predefined voltage levels at predefined thresholds, (v) utilize a semiconductor junction as a bandgap reference, and/or (vi) be implemented as one or more integrated circuits.

Figure 1:
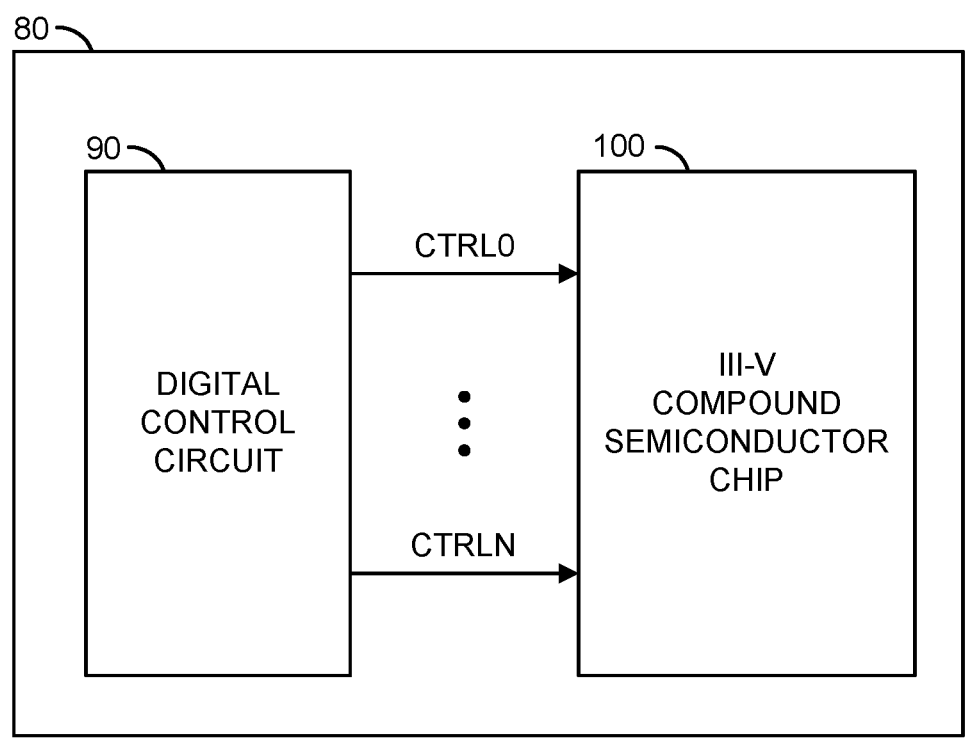
FIG. 1 is a diagram of a system illustrating a context of the invention.

Referring to FIG. 1, a block diagram of a system 80 is shown illustrating an example context of the invention. The system (or module or circuit or apparatus) 80 may implement, for example, a communication system. In some embodiments, the system 80 may implement a wireless communication system. In an example, the system 80 may form part of a communications link. In some embodiments, the communications link may be part of a fifth generation (5G) wireless communications system (e.g., for which a standard is currently under development by the Next Generation Mobile Networks (NGMN) Alliance). In other embodiments, the communications link may be part of systems including, but not limited to, a fourth generation (4G) wireless communications system (e.g., International Mobile Telecommunications-Advanced (IMT-A) standard published by the International Telecommunications Unit Radiocommunication Sector (ITU-R)), a satellite communication (SATCOM) system, and/or a point-to-point communications system such as common data link (CDL). However, other communications standards may be implemented to meet the design criteria of a particular application. In an example, the system 80 may be configured to operate at common wireless radio frequencies, millimeter-wave frequencies, and/or microwave frequencies. In an example, system may be configured to facilitate communication with and/or between a plurality of communications devices (or terminals). In an example, the communications devices may include, but are not limited to, cellular telephones, mobile devices, tablets, and internet-of-things (IoT) equipment.

In various embodiments, the system 80 may comprise a block (or circuit or module) 90 and a block (or circuit or module) 100. In an example, the circuit 90 may implement a digital control circuit portion of the system 80. In an example, the circuit 100 may implement a variety of circuit elements of a communication system. In various embodiments, the circuit 100 may be implemented using a III-V compound semiconductor technology (e.g., GaAs, GaN, InP, InGaP, SiC, etc.). In an example, the circuit 90 may be configured to generate a number of signals (e.g., CTRL0-CTRLN). In an example, the signals CTRL0-CTRLN may be implemented as digital control signals. In an example, each of the signals CTRL0-CTRLN may have a first state (e.g., a logic 0 or LOW) and a second state (e.g., a logic 1 or HIGH). Each of the first and the second states may be represented by a predefined voltage level or voltage range. In an example, the signals CTRL0-CTRLN may be implemented having CMOS logic compliant levels. In an example, the circuit 100 may comprise a variety of high frequency (e.g., radio, millimeter-wave, microwave, etc.) circuits including, but not limited to, power amplifier (PA) stages, variable gain amplifier (VGA) stages, variable phase shift stages, filters, and switches. In an example, respective bias, phase, and/or gain values of the circuit 100 may be programmed in response to the signals CTRL0-CTRLN.

In an example, the circuit 90 may implement a control circuit. In various embodiments, the circuit 90 may be implemented using one or more of an application specific integrated circuit (ASIC), controller, microprocessor, or circuitry configured accordingly. The circuit 90 is generally operational to control the operations of the of the system 80 and the circuit 100. In some embodiments, the circuit 90 may determine setting, configuration, and/or operating values used in the circuit 100. In various embodiments, the circuit 90 may be implemented as one or more integrated circuits.

Figure 2:
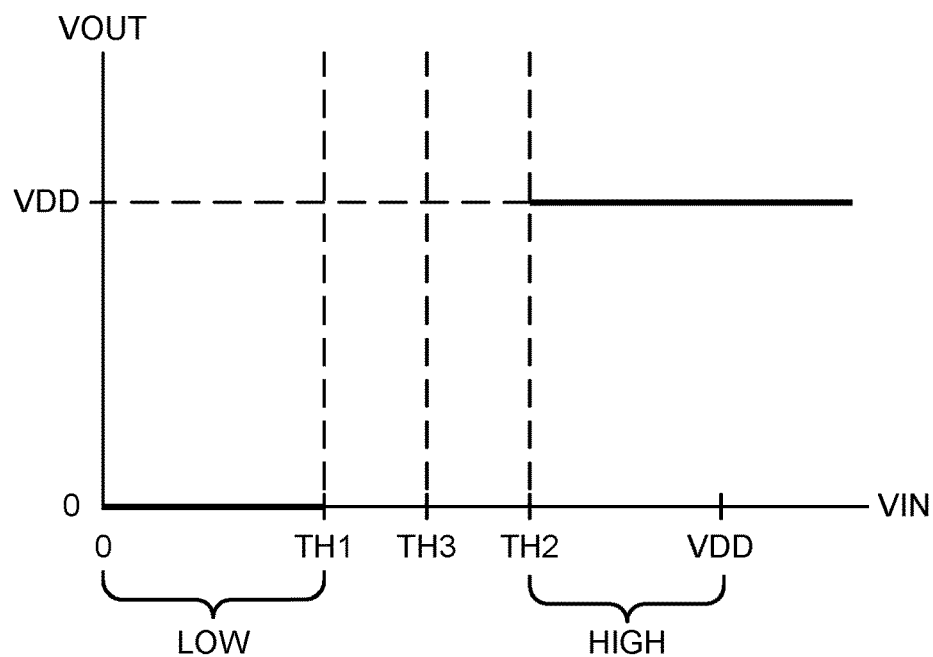
FIG. 2 is a diagram illustrating a transfer function in accordance with an example embodiment of the invention.

Referring to FIG. 2, a diagram is shown illustrating a control signal transfer function in accordance with an embodiment of the invention. In an example, the circuit 100 may be configured to receive the number of signals (e.g., CTRL0-CTRLN). In an example, the signals CTRL0-CTRLN may be implemented as digital control signals. Each of the signals CTRL0-CTRLN may have a first state (e.g., a logic 0 or LOW) and a second state (e.g., a logic 1 or HIGH). The first state may be represented by a first predefined threshold (e.g., TH1). The second state may be represented by a second predefined threshold (e.g., TH2). When the control signals CTRL0-CTRLN have a voltage level in a range from zero (ground potential) up to and including TH1, the signals CTRL0-CTRLN are considered to be a logic 0 or LOW. When the control signals CTRL0-CTRLN have a voltage level in a range from TH2 up to and including VDD, the signals CTRL0-CTRLN are considered to be a logic 1 or HIGH. In an example, the signals CTRL0-CTRLN may be implemented having CMOS logic compliant levels, where VDD is 5V, TH1 is 1.5V, and TH2 is 3.5V. However, other signal specifications may be implemented accordingly to meet design criteria of a particular implementation.

In general, gate circuit interpretations for signals having a voltage level between the thresholds TH1 and TH2 are not guaranteed. In an example, a threshold (e.g., TH3) may be defined in order to allow interpretation of signals that fall slightly out of the specified ranges. In an embodiment implement the TH3 threshold, when a signal has a voltage level below TH3, the signal may be considered to be a logic 0 or LOW, and when the signal has a voltage level above TH3, the signal may be considered to be a logic 1 or HIGH.

Figure 3:
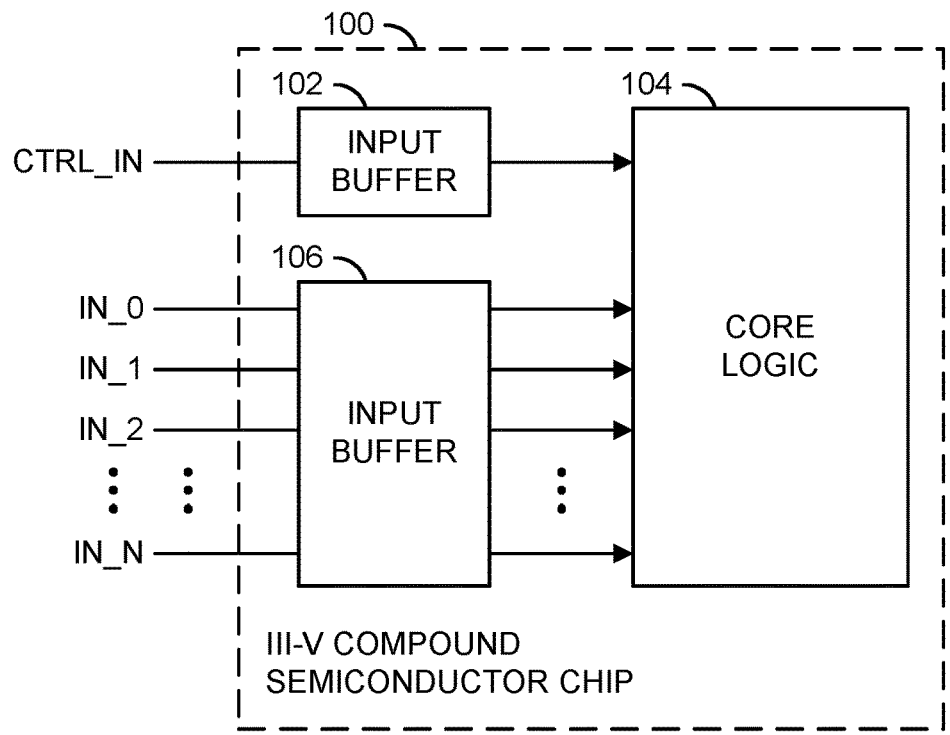
FIG. 3 is a diagram illustrating an integrated circuit context in accordance with an example embodiment of the invention.

Referring to FIG. 3, a diagram of a circuit 100 is shown illustrating an integrated circuit context in accordance with an example embodiment of the invention. In various embodiments, the circuit 100 may comprise a III-V compound semiconductor integrated circuit. In an example, the circuit 100 may be implemented using process technology including, but not limited to, gallium arsenide (GaAs), indium gallium phosphide (InGaP), indium phosphide (inP), gallium nitride (GaN), and silicon carbide (SiC). In various embodiments, the circuit 100 may be configured to work with standard digital logic (e.g., CMOS, TTL, etc.) signals. In an example, compatibility with standard digital logic control signals (e.g., CMOS, etc.) generally facilitates easy integration of high power, high speed III-V compound semiconductor integrated circuits with CMOS control circuits. The circuit 100 is generally configured to allow direct application of externally generated digital logic level (e.g., CMOS, etc.) control signals to input pins (or pads) of the circuit 100. The circuit 100 is generally configured to generate internal control signals in response to externally generated digital logic level (e.g., CMOS, etc.) control signals.

In various embodiments, the circuit 100 may comprise a block (or circuit) 102, a block (or circuit) 104, a block (or circuit) 106, and or any combination or number thereof. In an example, the circuit 102 may implement a single-bit input buffer circuit. In an example, the circuit 104 may implement internal (core) circuitry of the circuit 100. In an example, the circuit 106 may implement a multi-bit input buffer circuit. The circuit 102 and/or the circuit 106 are generally configured to provide a digital control interface between the circuit 104 and external circuitry connected to the circuit 100. In various embodiments, the circuit 102 may have an input that receives an external control signal (e.g., CTRL_IN) and one or more outputs that present one or more internal control signals to the circuit 104. In an example, the input of the circuit 102 may be configured to receive the external signal via a connection (e.g., a pin, a pad, a bump, or other method of electrically connecting the circuit 100 to external circuitry) to an external source. In various embodiments, the external signal may be characterized as having at least two logic states (e.g., a logic LOW and a logic HIGH) represented by predefined voltage levels (e.g., CMOS levels, etc.). The circuit 102 may be configured to generate the internal control signal(s) responsive to a particular state of the input signal CTRL_IN.

In various embodiments, the circuit 106 may have a number (e.g., n) of inputs that receive a corresponding number of external control signals (e.g., IN_0-IN_N) and a corresponding number (e.g., n, 2n, $2^n$, etc.) of outputs that present internal control signals to the circuit 104. In an example, the inputs of the circuit 106 may be configured to receive the external signals via respective connections (e.g., pins, pads, bumps, or other method of electrically connecting the circuit 100 to external circuitry) to an external source or sources. In various embodiments, the external signals may be characterized as having at least two logic states (e.g., a logic LOW and a logic HIGH) represented by predefined voltage levels (e.g., CMOS levels, etc.). The circuit 106 may be configured to generate the internal control signals responsive to particular states of the input signals IN_0-IN_N.

In an example, the circuit 104 may comprise a variety of high frequency, (e.g., radio, millimeter-wave, microwave, etc.) circuits including, but not limited to, power amplifier (PA) stages, variable gain amplifier (VGA) stages, variable phase shift stages, filters, and switches. In an example, respective bias, phase, and/or gain values of the circuit 100 may be programmed in response to the internal control signals received from the circuit 102 and/or the circuit 106. In another example, signal paths may be controlled by one or more switches within the circuit 104 to vary signal routs in response to one or more of the internal control signals.

Figure 4:
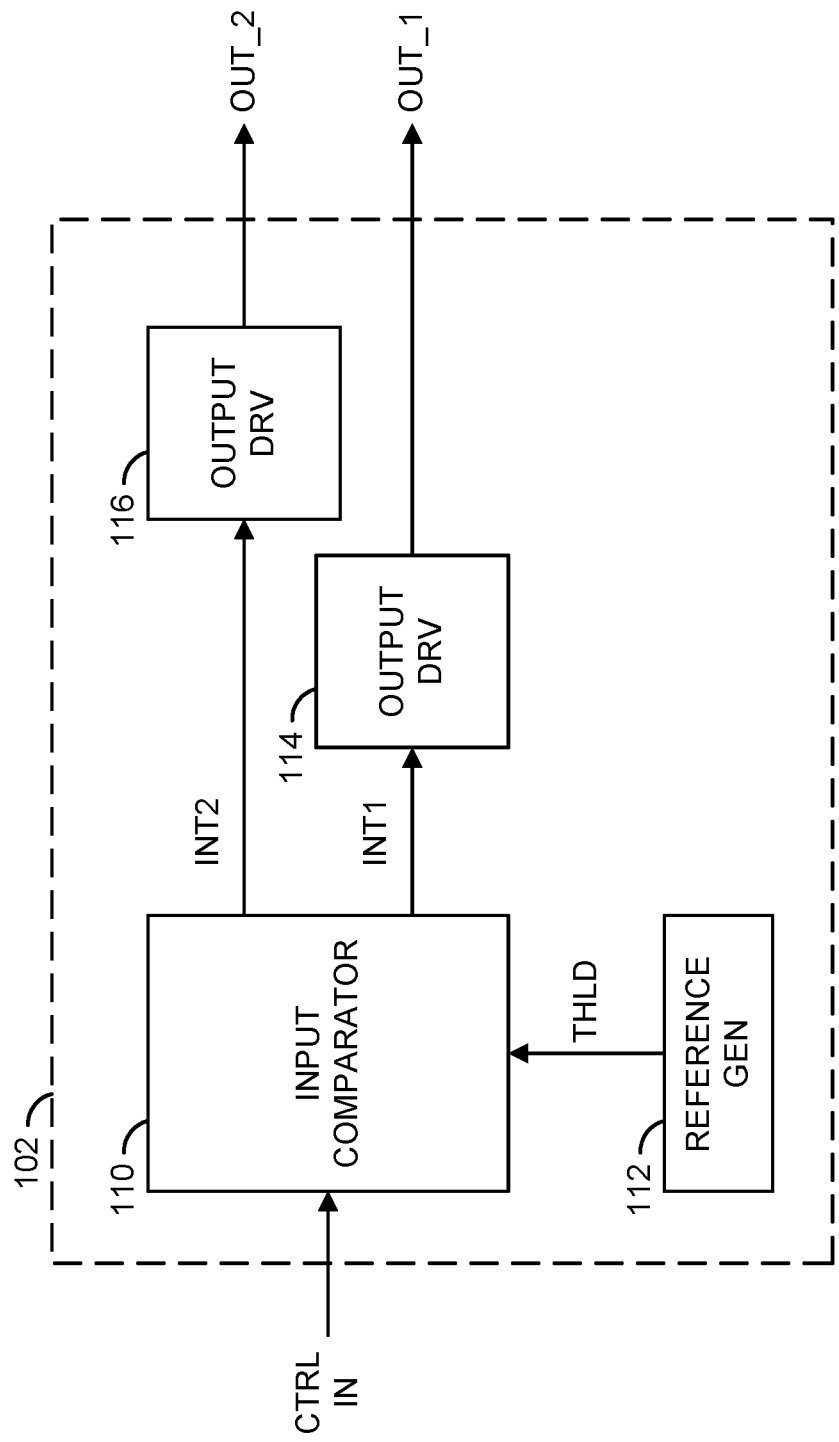
FIG. 4 is a diagram illustrating an example single-bit input buffer circuit in accordance with an example embodiment of the invention.

Referring to FIG. 4, a block diagram of the circuit 102 is shown illustrating an example implementation of a single-bit input buffer circuit in accordance with an example embodiment of the invention. In an example, the circuit 102 may comprise a block (or circuit) 110, a block (or circuit) 112, a block (or circuit) 114, and a block (or circuit) 116. The block 110 may implement an input comparator circuit. The block 112 may implement a reference generator circuit. The blocks 114 and 116 may implement output driver circuits. In an example, the circuit 110 may have a first input that may receive the signal CTRL_IN, a second input that may receive a predefined threshold voltage (e.g., THLD), and one or more outputs that may present a respective intermediate signal. The circuit 110 may be configured to generate the one or more intermediate signals in response to the signals CTRL_IN and THLD. In an example, a value of the one or more intermediate signals may be based upon a comparison between a voltage level of the signal CTRL_IN and a voltage level of the signal THLD.

The circuit 112 may be configured to generate the predefined threshold voltage THLD based upon a substantially stable characteristic of the III-V compound semiconductor material. In an example, the circuit 112 may be implemented as a bandgap reference voltage generator. In an example, the circuit 112 may use a junction of the compound semiconductor to produce a reference voltage level that is substantially stable over process, voltage, and temperature (PVT) corners of the particular semiconductor technology. In an example, the circuit 112 may be configured to generate the signal THLD as the threshold value TH3 in FIG. 2.

Each of the circuits 114 and 116 may receive a respective intermediate signal from the circuit 110. The circuit 114 may be configured to generate a respective output signal (e.g., OUT_1) in response to the respective intermediate signal received from the circuit 110. The circuit 116 may be configured to generate a respective output signal (e.g., OUT_2) in response to the respective intermediate signal received from the circuit 110. The signals OUT_1 and OUT_2 are generally configured to control respective portions of the core circuitry 104.

Figure 5:
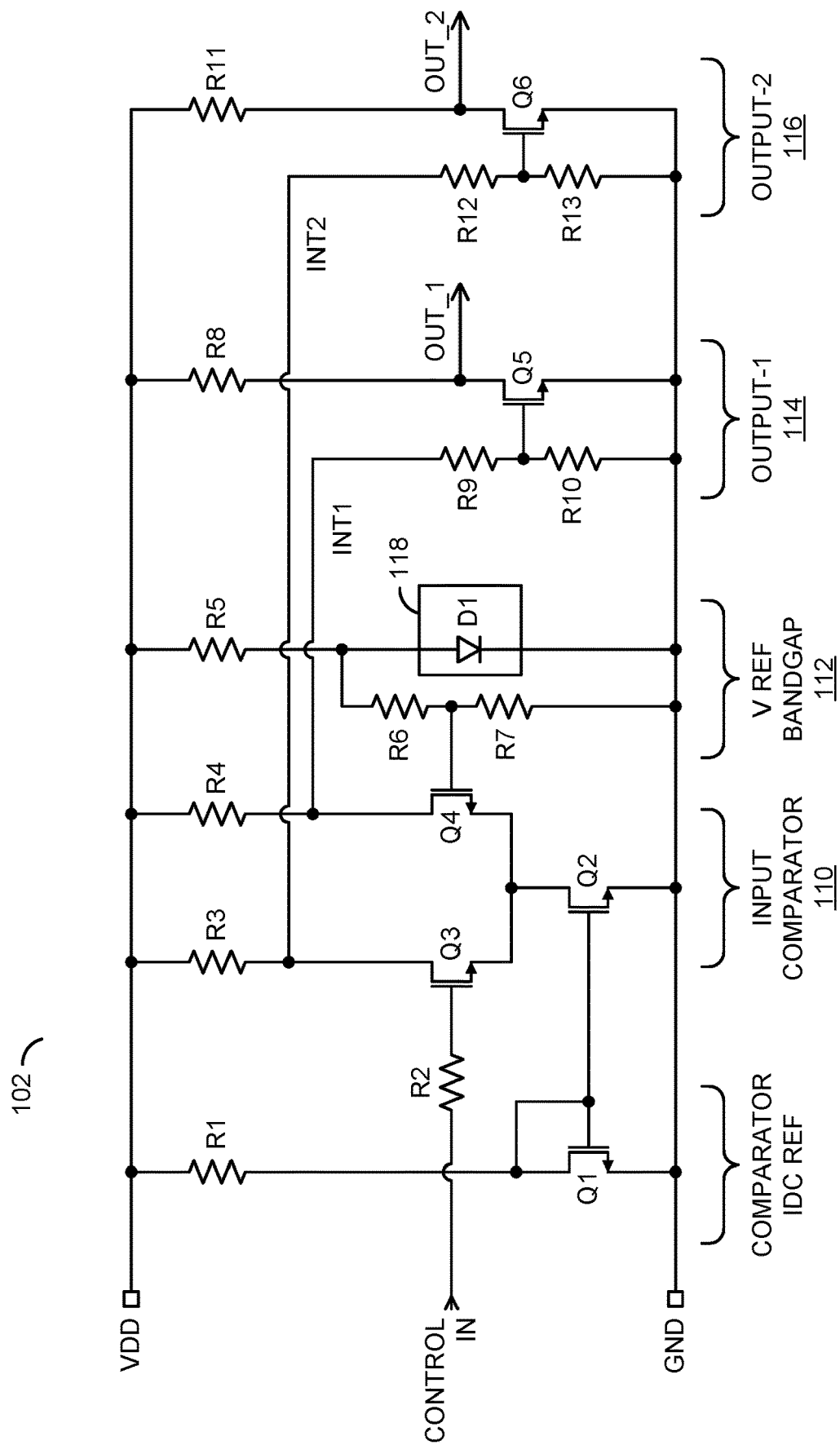
FIG. 5 is a diagram illustrating an example implementation of the input buffer circuit of FIG. 4.

Referring to FIG. 5, a schematic diagram is shown illustrating an example implementation of the single-bit input buffer circuit 102 of FIG. 4. In an example, the circuit 102 may implement the circuits 110-116 using a number of transistors Q1-Q6, a number of resistors R1-R13, and a semiconductor junction device 118. In an example, the circuit 110 may comprise transistors Q1-Q4 and resistors R1-R4. The resistor R1 may be connected between a positive supply voltage (e.g., VDD) and a drain terminal of the transistor Q1. The drain terminal of the transistor Q1 may be connected to a gate terminal of the transistor Q1 and a gate terminal of the transistor Q2. A source terminal of the transistor Q1 and a source terminal of the transistor Q2 may be connected to a circuit ground potential (e.g., GND). A drain terminal of the transistor Q2 may be connected to source terminals of the transistors Q3 and Q4. The resistor R2 may be configured to couple the signal CTRL_IN to a gate terminal of the transistor Q3. The resistor R3 may be connected between the positive supply voltage VDD and a drain terminal of the transistor Q3. The resistor R4 may be connected between the positive supply voltage VDD and a drain terminal of the transistor Q4.

The transistors Q1 is generally configured to generated a reference current. The reference current is generally mirrored by the transistor Q2 for use in a differential comparator formed by the transistors Q3 and Q4. The differential comparator formed by the transistor Q3 and Q4 compares the voltage level of the signal CTRL_IN presented to the gate of the transistor Q3 to a reference voltage level presented to a gate of the transistor Q4. Intermediate signals representative of the comparison are presented at the respective source terminals of the transistor Q3 and Q4.

In an example, the reference generator circuit 112 may be implemented as a bandgap reference. In an example, the resistor R5 may be connected between the positive supply voltage VDD and first terminal of the semiconductor junction device 118. A second terminal of the semiconductor junction device 118 may be connected to the ground potential GND. The semiconductor junction device 118 is generally configured to present a bandgap voltage of the particular compound semiconductor material (e.g., 1.2V for GaAs). In an example, the semiconductor junction device 118 may be implemented as a diode junction, transistor junction, parasitic junction, or other junction type that may be produced in a particular semiconductor technology.

In various embodiments, the voltage presented at the first terminal of the semiconductor junction device 118 is presented to a voltage divider formed by the resistors R6 and R7. In an example, the first terminal of the semiconductor junction device 118 is connected to a first terminal of the resistor R6. A second terminal of the resistor R6 is connected to a first terminal of the resistor R7 and the gate terminal of the transistor Q4. A second terminal of the resistor R7 is connected to the ground potential GND. The values of the resistors R6 and R7 are generally selected to produce a desired threshold level (e.g., TH3).

In an example, the output driver circuit 114 may be implemented with the transistor Q5 and the resistors R8-R10. The resistor R8 may be connected between the positive supply voltage VDD and a drain terminal of the transistor Q5. A source terminal of the transistor Q5 may be connected to the ground potential GND. A gate terminal of the transistor Q5 may be connected to a first terminal of the resistor R9 and a first terminal of the resistor R10. A second terminal of the resistor R9 may be connected to the drain terminal of the transistor Q4. A second terminal of the resistor R9 may be connected to the circuit ground potential GND. The output signal OUT_1 may be presented at the drain terminal of the transistor Q5. The values of the resistors R9 and R10 are generally selected to produce a desired switch point for the transistor Q5.

In an example, the output driver circuit 116 may be implemented with the transistor Q6 and the resistors R11-R13. The resistor R11 may be connected between the positive supply voltage VDD and a drain terminal of the transistor Q6. A source terminal of the transistor Q6 may be connected to the ground potential GND. A gate terminal of the transistor Q6 may be connected to a first terminal of the resistor R12 and a first terminal of the resistor R11. A second terminal of the resistor R12 may be connected to the drain terminal of the transistor Q3. A second terminal of the resistor R13 may be connected to the circuit ground potential GND. The output signal OUT_2 may be presented at the drain terminal of the transistor Q6. The values of the resistors R12 and R13 are generally selected to produce a desired switch point for the transistor Q6.

Figure 6:
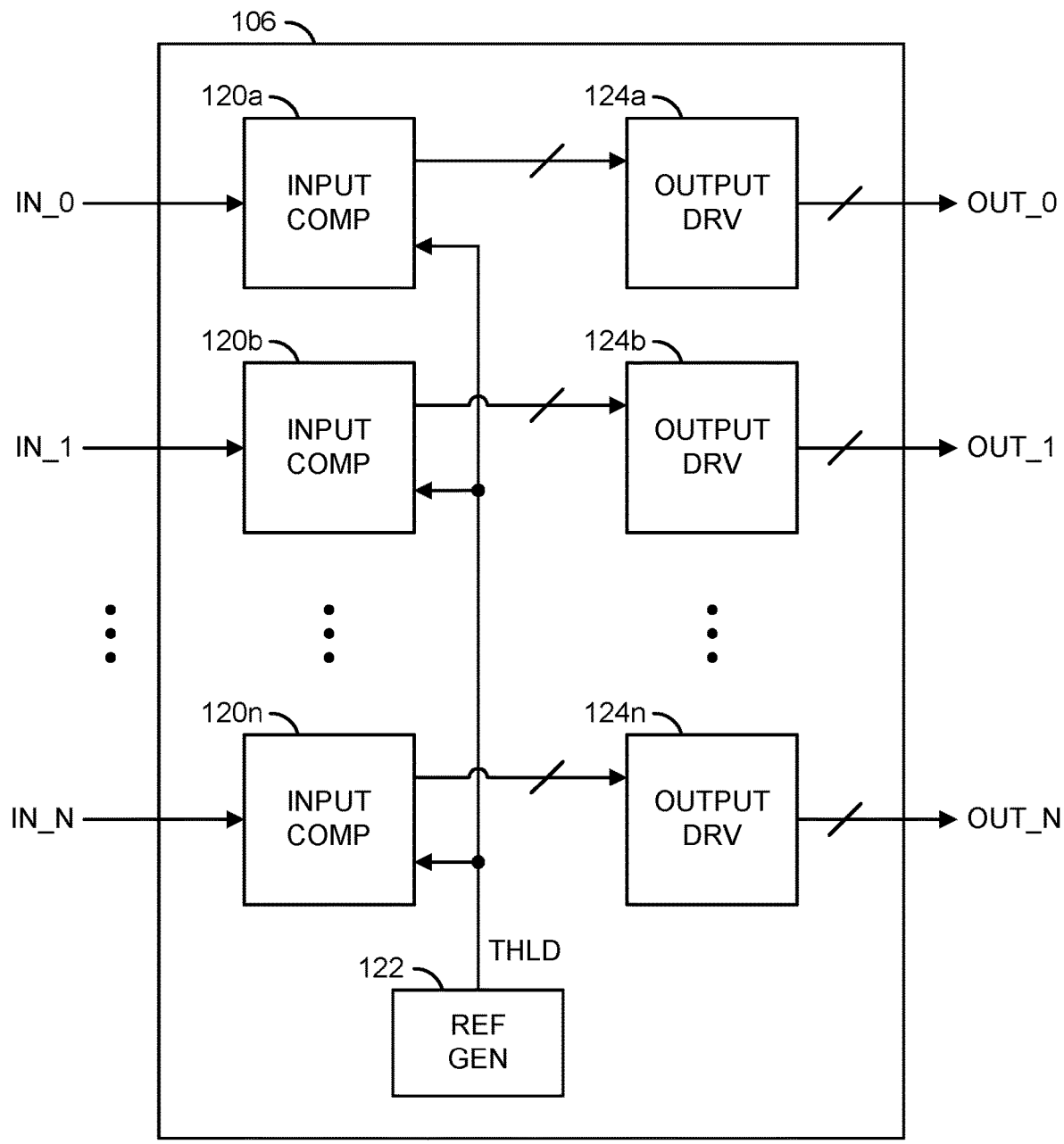
FIG. 6 is a diagram illustrating an example multi-bit input buffer circuit in accordance with another example embodiment of the invention.

Referring to FIG. 6, a block diagram is shown illustrating an example implementation of the multi-bit input buffer circuit 106 of FIG. 3. In an example, the circuit 106 may comprise a number of blocks (or circuits) 120a-120n, a block (or circuit) 122, and a number of blocks (or circuits) 124a-124n. The blocks 120a-120n may implement input comparator circuits. The block 112 may implement a reference generator circuit. The blocks 124a-124n may implement output driver circuits. In an example, each of the circuits 120a-120n may have a first input that may receive a respective one of the signals IN_0-IN_N, a second input that may receive a predefined threshold voltage (e.g., THLD), and one or more outputs that may present a respective intermediate signal. The circuits 120a-120n may be configured to generate the one or more intermediate signals in response to the respective one of the signals IN_0-IN_N and the signal THLD. In an example, a value of the one or more intermediate signals may be based upon a comparison between a voltage level of the respective one of the signals IN_0-IN_N and a voltage level of the signal THLD.

The circuit 122 may be configured to generate the predefined threshold voltage THLD based upon a substantially stable junction potential characteristic of the III-V compound semiconductor material. In an example, the circuit 122 may be implemented as a bandgap reference voltage generator. In an example, the circuit 122 may use a junction device of the compound semiconductor to produce a reference voltage level that is substantially stable over process, voltage, and temperature (PVT) corners of the particular semiconductor technology. In an example, the circuit 122 may be configured to generate the signal THLD as the threshold value TH3 in FIG. 2.

Each of the circuits 124a-124n may receive a respective intermediate signal from a corresponding circuit 120a-120n. The circuits 124a-124n may be configured to generate respective output signals (e.g., OUT_0-OUT_N) in response to the respective intermediate signal received from the corresponding circuit 120a-120n. In some embodiments, a number of blocks (or circuits) 126a-126n may be implemented similarly to the circuit 116 of FIG. 4 and configured to generate a second set of respective output signals in response to a respective intermediate signal received from the circuits 120a-120n. The signals OUT_0OUT_N are generally configured to control respective portions of the core circuitry 104.

Figure 7:
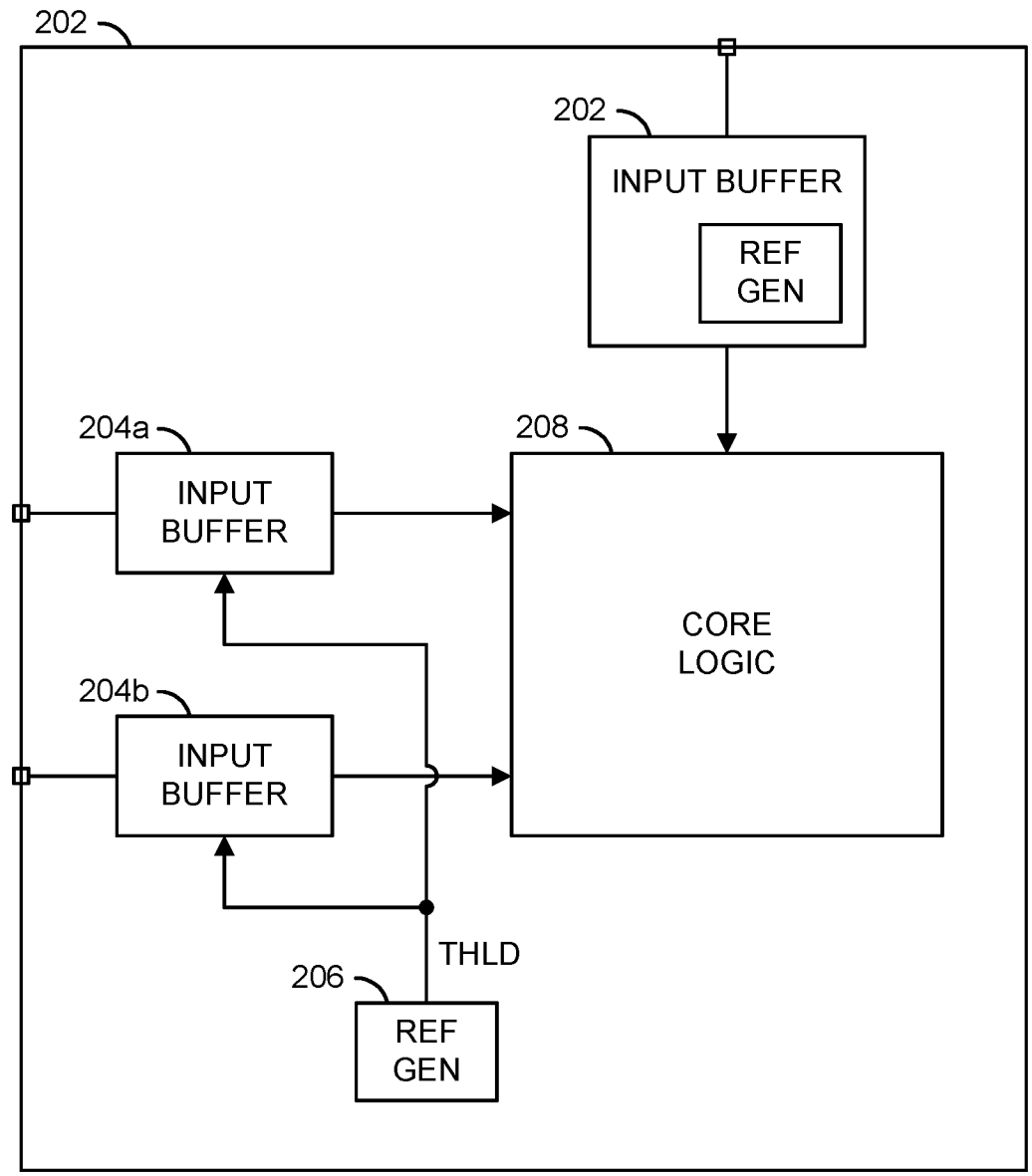
FIG. 7 is a diagram illustrating an integrated circuit in accordance with another example embodiment of the invention.

Referring to FIG. 7, a diagram of an integrated circuit 200 is shown illustrating another example implementation in accordance with an example embodiment of the invention. In various embodiments, the circuit 200 may comprise a III-V compound semiconductor integrated circuit. In an example, the circuit 200 may be implemented using process technology including, but not limited to, gallium arsenide (GaAs), indium phosphide (InP), indium gallium phosphide (InGaP), gallium nitride (GaN) and silicon carbide (SIC). In various embodiments, the circuit 200 may be configured to work with standard digital logic (e.g., CMOS, TTL, etc.) signals. In an example, compatibility with standard digital logic control signals (e.g., CMOS, etc.) generally facilitates easy integration of high power, high speed III-V compound semiconductor integrated circuits with CMOS control circuits. The circuit 200 is generally configured to allow direct application of externally generated digital logic level (e.g., CMOS, etc.) control signals to input pins (or pads) of the circuit 200. The circuit 200 is generally configured to generate internal control signals in response to externally generated digital logic level (e.g., CMOS, etc.) control signals.

In various embodiments, the circuit 200 may comprise a block (or circuit) 202, a number of blocks (or circuits) 204a-204b, a block (or circuit) 206, a block (or circuit) 208, and or any combination or number thereof. In an example, the circuit 202 may implement a single-bit input buffer circuit with integrated reference generator. In an example, the circuits 204a-204b may implement single-bit input buffer circuits without internal reference generators. The circuit 206 may implement a reference generator circuit for providing a reference voltage to the circuit 204a and 204b. The circuit 208 may implement internal (core) circuitry of the circuit 200. The circuit 202 and/or the circuits 204a and 204b are generally configured to provide a digital control interface between the circuit 208 and external circuitry connected to the circuit 200 (e.g., via pins, pads, bumps, or other method of electrically connection). In various embodiments, the external signal may be characterized as having at least two logic states (e.g., a logic LOW and a logic HIGH) represented by predefined voltage levels (e.g., CMOS levels, etc.).

In an example, the reference threshold voltage source 206 may be placed individually near an input buffer (comparator), or shared between multiple input buffers (comparators). The implementation of shared versus individual reference generators may be a matter of balancing current consumption reduction versus physical layout and routing constraints. In general, when I/O blocks (or circuits) need to be spread across (or around) the die or there are signal routing constraints, the threshold reference generators may be duplicated and placed where needed.

Although embodiments of the invention have been described in the context of a 5G application, the present invention is not limited to 5G applications, but may also be applied in other high power, high data rate wireless and wired communications applications where different rapid switching, multiple channel, and multiple user issues may exist. The present invention addresses concerns related to high speed wireless communications, mobile and stationary transceivers and point-to-point links. Future generations of wireless communications applications using radio frequency (RF), microwave, and millimeter-wave links can be expected to provide increasing power, increasing speed, increasing flexibility, and increasing numbers of interconnections and layers. The present invention may also be applicable to wireless communications systems implemented in compliance with either existing (legacy, 2G, 3G, 4G) specifications or future specifications.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising a III-V compound semiconductor integrated circuit comprising an input buffer circuit configured to provide a digital control interface between internal circuitry and external circuitry connected to an input pin of the III-V compound semiconductor integrated circuit, said input buffer circuit comprising:
   a device comprising a semiconductor junction formed in a III-V compound semiconductor material and configured to generate a reference voltage;
   a voltage divider circuit formed in said III-V compound semiconductor material and configured to generate a first predetermined threshold voltage in response to the reference voltage;
   a comparator circuit formed in said III-V compound semiconductor material and configured to generate a first intermediate signal in response to a comparison of the first predetermined threshold voltage and a digital input signal received at the input pin of the III-V compound semiconductor integrated circuit, said digital input signal having a first logic state represented by a first predefined voltage level and a second logic state represented by a second predefined voltage level; and
   a first output circuit formed in said III-V compound semiconductor material and configured to generate a first output signal in response to the first intermediate signal, wherein the first output signal is configured to control the internal circuitry of the III-V compound semiconductor integrated circuit.

2. The apparatus according to claim 1, wherein:
   the comparator circuit is further configured to generate a second intermediate signal in response to the comparison of the first predetermined threshold voltage and the digital input signal; and
   the input buffer circuit further comprises a second output circuit formed in said III-V compound semiconductor material and configured to generate a second output signal in response to the second intermediate signal, wherein the second output signal is configured to control the internal circuitry of the III-V compound semiconductor integrated circuit.

3. The apparatus according to claim 2, wherein:
the second intermediate signal is a complement of the first intermediate signal.

4. The apparatus according to claim 2, wherein:
the second output signal is a complement of the first output signal.

5. The apparatus according to claim 1, wherein said III-V compound semiconductor material comprises at least one of a gallium arsenide alloy, a gallium nitride alloy, an indium phosphide alloy, an indium gallium phosphide alloy, and a silicon carbide alloy.

6. The apparatus according to claim 1, wherein said semiconductor junction comprises at least one of a diode junction, a transistor junction, and a parasitic junction.

7. The apparatus according to claim 1, wherein said reference voltage is stable over variations in one or more of process, voltage, and temperature.

8. The apparatus according to claim 1, wherein said first predetermined threshold voltage is selected to be compliant with one or more digital logic standards.

9. The apparatus according to claim 1, wherein said first predetermined threshold voltage is selected to be compliant with one or more complementary metal-oxide-semiconductor (CMOS) logic standards.

10. The apparatus according to claim 1, wherein said device comprising said semiconductor junction generates said reference voltage for at least one of (i) a single-bit input buffer circuit, (ii) a multi-bit input buffer circuit, and (iii) two or more input buffer circuits.

11. The apparatus according to claim 1, wherein:
said apparatus further comprises a digital control circuit coupled to said III-V compound semiconductor integrated circuit and configured to present said digital input signal to the input pin of said III-V compound semiconductor integrated circuit.

12. The apparatus according to claim 11, wherein said digital control circuit comprises a complementary metal oxide semiconductor integrated circuit.

* * * * *